United States Patent
Takahashi et al.

(10) Patent No.: US 6,792,583 B1
(45) Date of Patent: Sep. 14, 2004

(54) INFORMATION PROCESSING APPARATUS, INFORMATION PROCESSING SYSTEM, AND STORAGE MEDIA

(75) Inventors: Yoshitaka Takahashi, Hitachi (JP); Kotaro Shimamura, Hitachinaka (JP); Takashi Hotta, Hitachi (JP); Teppei Hirotsu, Hitachi (JP); Katsuichi Tomobe, Ome (JP)

(73) Assignee: Renesas Technology Corp, Tokyo (JP)

( * ) Notice: Subject to any disclaimer, the term of this patent is extended or adjusted under 35 U.S.C. 154(b) by 0 days.

(21) Appl. No.: 09/501,977

(22) Filed: Feb. 11, 2000

(30) Foreign Application Priority Data

Feb. 12, 1999 (JP) .......................................... 11-033767

(51) Int. Cl.$^7$ ................................................ G06F 9/45
(52) U.S. Cl. ................................................ 716/8; 716/4
(58) Field of Search ............................ 716/4, 8, 10, 11

(56) References Cited

U.S. PATENT DOCUMENTS 4,918,614 A * 4/1990 Modarres et al. ............. 716/10
5,910,899 A * 6/1999 Barrientos ..................... 716/11
6,002,857 A * 12/1999 Ramachandran ............. 716/13
6,170,080 B1 * 1/2001 Ginetti et al. ................ 716/18
6,243,851 B1 * 6/2001 Hwang et al. ................ 716/10

FOREIGN PATENT DOCUMENTS

| EP | 0294188 | * 12/1988 | ........... G06F/15/60 |
| JP | A-10-79436 | 3/1989 | |
| JP | A-9-330350 | 12/1997 | |

* cited by examiner

*Primary Examiner*—Stacy A. Whitmore
(74) *Attorney, Agent, or Firm*—Antonelli, Terry, Stout & Kraus, LLP

(57) ABSTRACT

In an information processing apparatus, a user having no knowledge of a designer of an LSI modifies a floorplan of the LSI without deteriorating the performance of the LSI. The designer who designs the LSI uses a circuit designing apparatus to store circuit information including a functions of each of blocks constituting the LSI, a floorplan regarding allocation of the blocks, and evaluation indices which are the know-how of the designer, with being associated with each other. The user uses a floorplan modifying apparatus to modify the floorplan and to evaluate the modified floorplan according to the evaluation indices.

2 Claims, 18 Drawing Sheets

| CLASSIFICATION | SPECIFICATION | EXPLANATION |
|---|---|---|
| BLOCK MOVEMENT RULE | remove | MOVEMENT SPECIFICATION OF ANOTHER BLOCK WHEN CERTAIN BLOCK IS REMOVED<br>EXAMPLE : remove: f2→f3: left |
| | add | MOVEMENT SPECIFICATION OF ANOTHER BLOCK WHEN CERTAIN BLOCK IS ADDED<br>EXAMPLE : add: f2→f3: right |
| BLOCK ALLOCATION RULE | group | SPECIFICATION OF GROUP OF BLOCKS TO BE ALLOCATED IN THE NEIGHBORHOOD<br>EXAMPLE : group : g1, g2 |
| | datapath | SPECIFICATION OF GROUP OF BLOCKS AS DATA PATH<br>EXAMPLE : datapath: g2, g3, g4, g5 |
| PERIPHERAL CIRCUIT i / f INFORMATION | i / f | SPECIFICATION OF BLOCK TO BE ALLOCATED IN THE VICINITY OF EXTERNAL CIRCUIT abc<br>EXAMPLE : i / f : RAM: g5 |

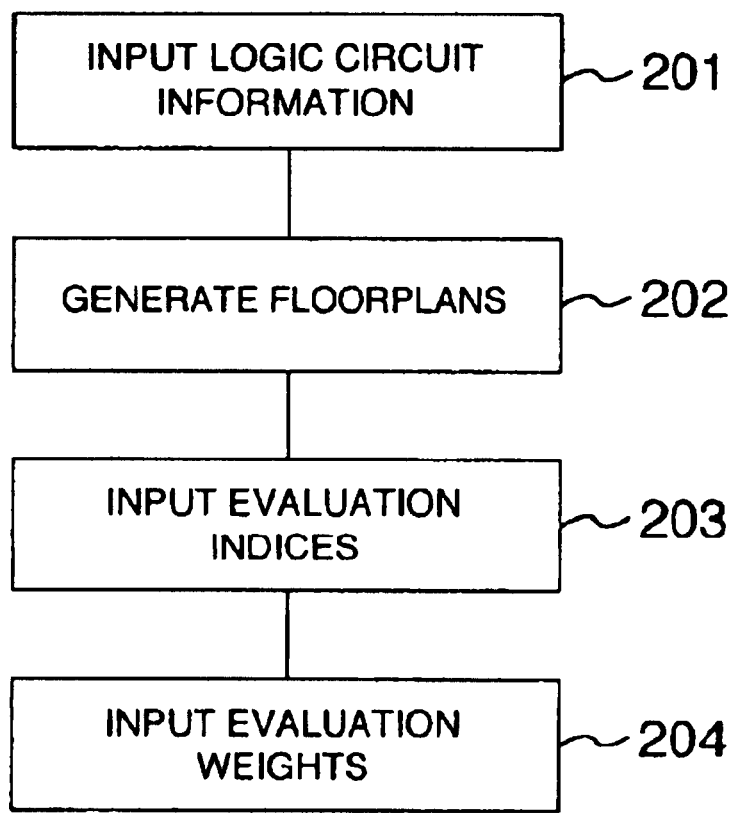

FIG. 3A
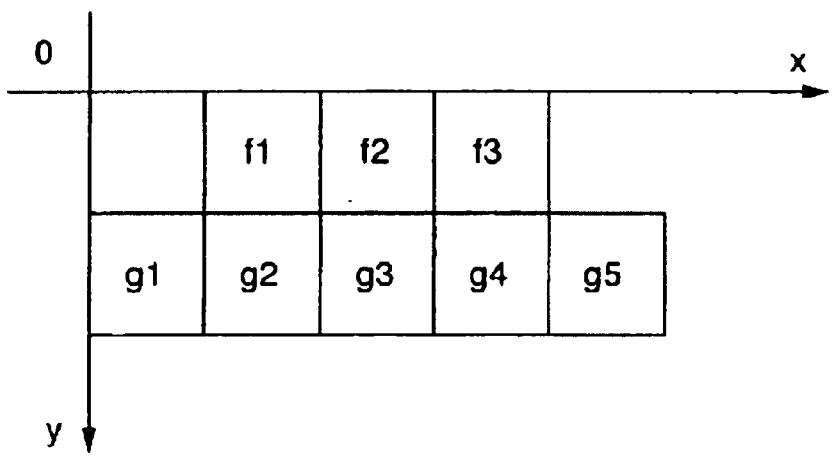
FIG. 3B
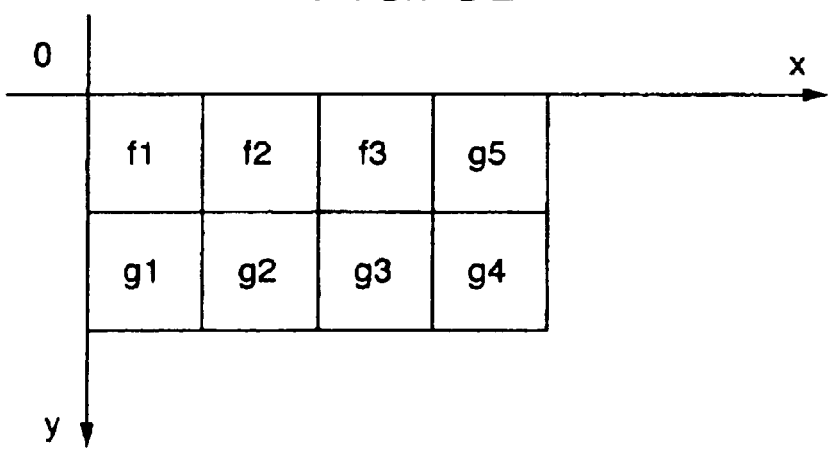
FIG. 3C
```
                  401
pri : speed
f1 : (13, 0) 13 14
f2 : (26, 0) 13 14
f3 : (39, 0) 13 14
g1 : ( 0,14) 13 14
g2 : (13,14) 13 14
g3 : (26,14) 13 14
g4 : (39,14) 13 14
g5 : (52,14) 13 14
```
FIG. 3D
```
                  402
pri : space
f1 : ( 0, 0) 13 14
f2 : (13, 0) 13 14
f3 : (26, 0) 20 14
g1 : ( 0,14) 13 14
g2 : (13,14) 13 14
g3 : (26,14) 20 14
g4 : (39,14) 20 14
g5 : (39,14) 20 14
```

```
place : (0,0)
density : 0.8
aspect : 12  10
remove : f2
i / f : RAM : (100, 0)
pri : space
dp-direction : vertical
```
701

FIG. 9B
```
place : (0, 0)
density : 0.8
aspect : 12 10
remove : f2
i / f RAM : (100, 0)
pri : space
dp-direction : vertical
```
FIG. 9A
| | | | | | |
|---|---|---|---|---|---|
| datapath | f1 | f2 | f3 | | 100 |
| group | f1 | g1 | | | 1 |
| group | g2 | g3 | | | 1 |
| i / f : RAM | g3 | | | | |
| remove | f2 : f3 | left | | | 1 |
FIG. 9C
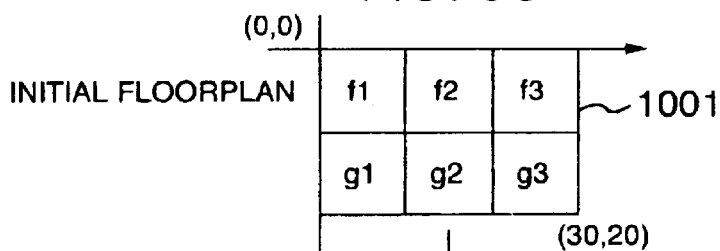
INITIAL FLOORPLAN
FIG. 9D
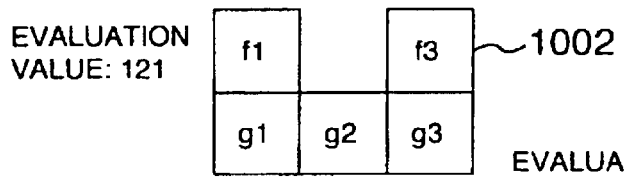
EVALUATION VALUE: 121
FIG. 9E
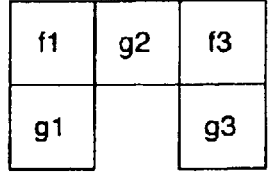
EVALUATION VALUE: 125
FIG. 9F
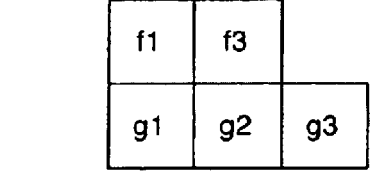
EVALUATION VALUE: 20
FIG. 9G
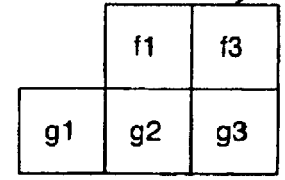
EVALUATION VALUE: 25
FIG. 9H
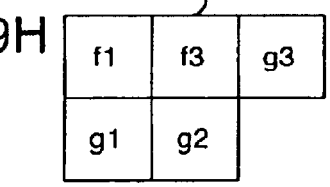
EVALUATION VALUE: 24
FIG. 9I
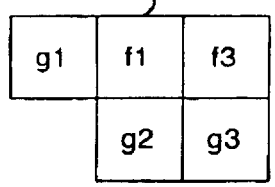
EVALUATION VALUE: 25

FIG. 10A

| f4 | f1 | f2 | f3 |
|---|---|---|---|
| ▨ | g1 | g2 | g3 |

FIG. 10B

| f4 |    | f2 | f3 |
|---|---|---|---|
| f1 | g1 | g2 | g3 |

FIG. 10C

| f4 | f1 |    | f3 |
|---|---|---|---|
| f2 | g1 | g2 | g3 |

FIG. 10D

| f4 | f1 | f2 |    |
|---|---|---|---|
| f3 | g1 | g2 | g3 |

FIG. 10E

| f4 | f1 | f2 | f3 |
|---|---|---|---|
| g1 |    | g2 | g3 |

FIG. 10F

| f4 | f1 | f2 | f3 |
|---|---|---|---|
| g2 | g1 |    | g3 |

FIG. 10G

| f4 | f1 | f2 | f3 |
|---|---|---|---|
| g3 | g1 | g2 |    |

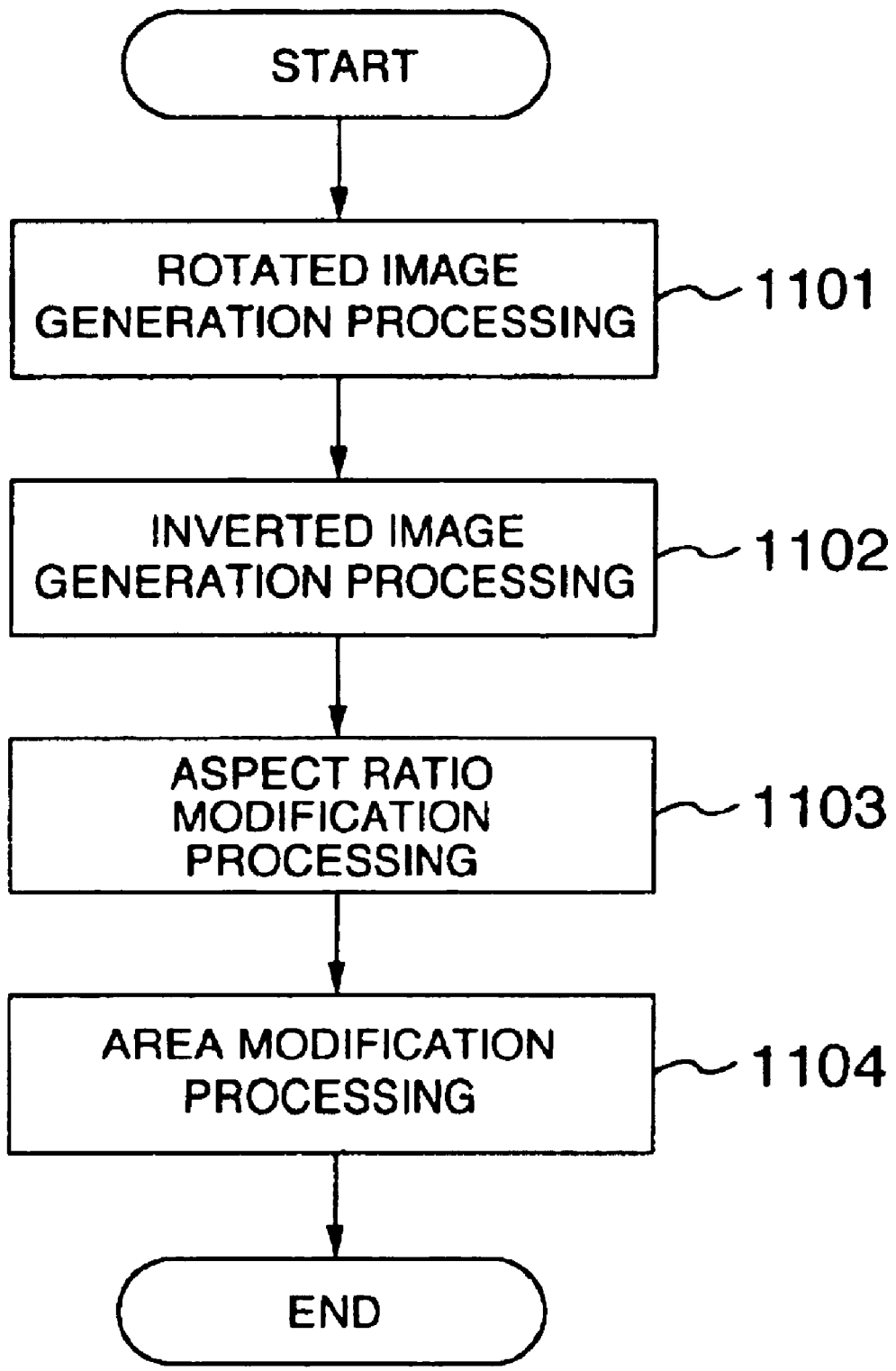

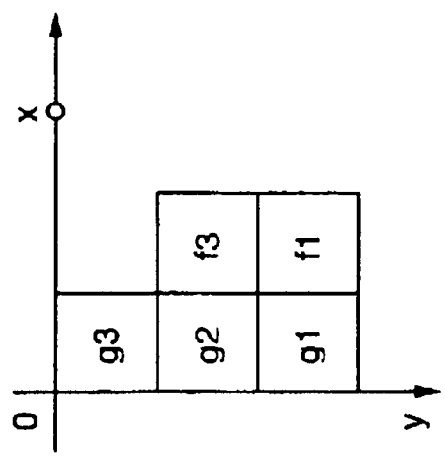
FIG. 15A
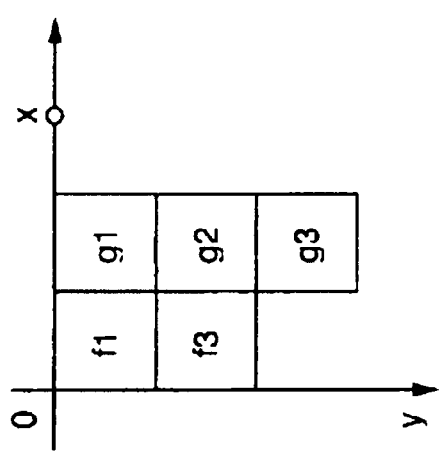
FIG. 15B
FIG. 15C
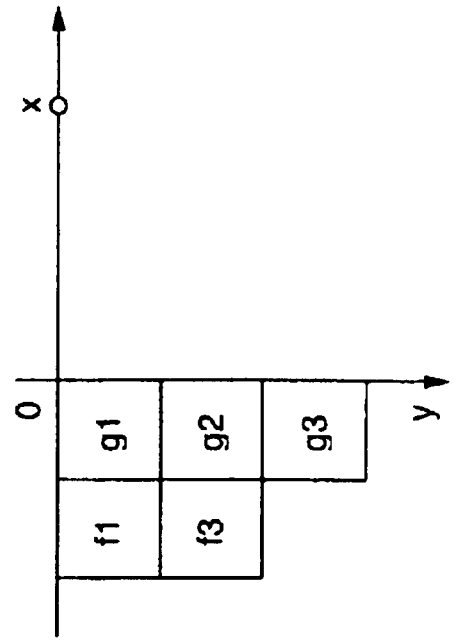
FIG. 15E
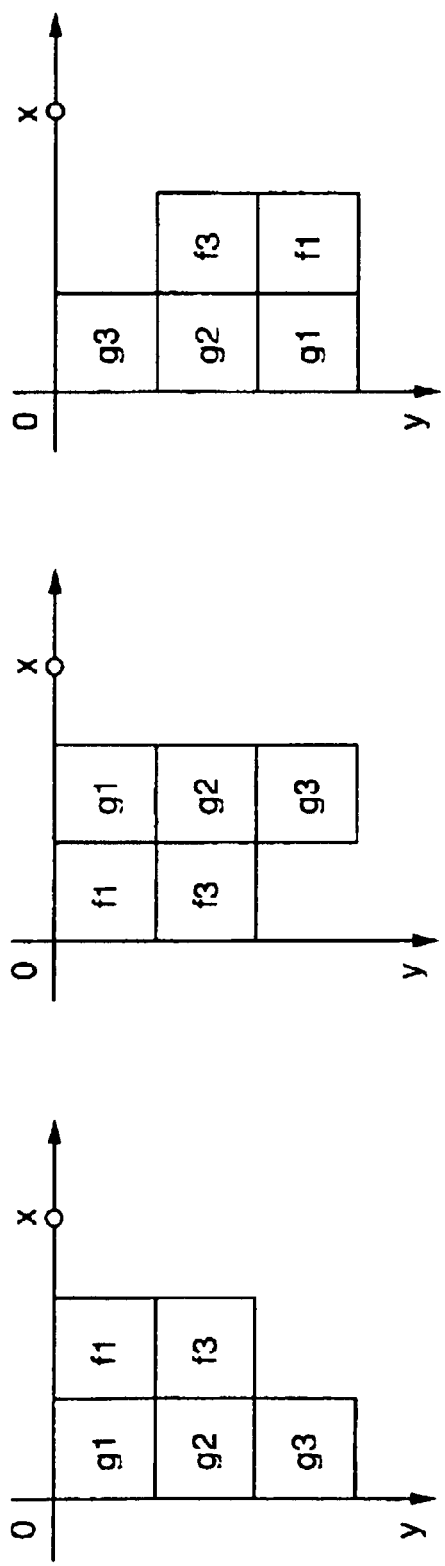
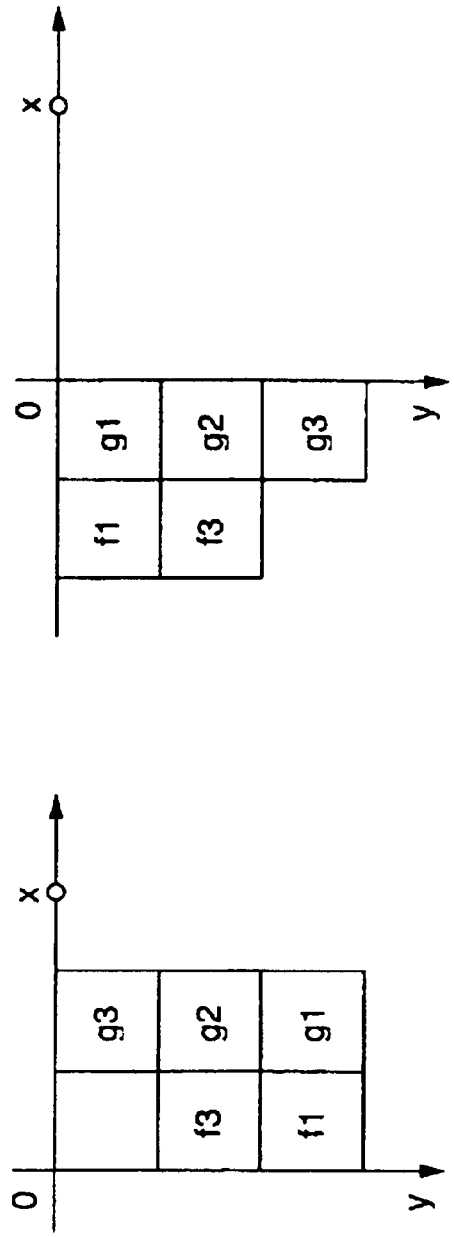
FIG. 15D FIG. 17A
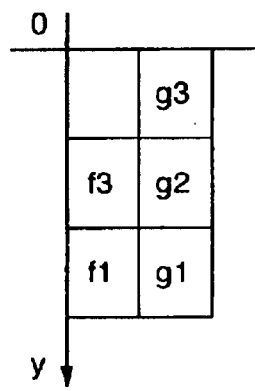
FIG. 17B
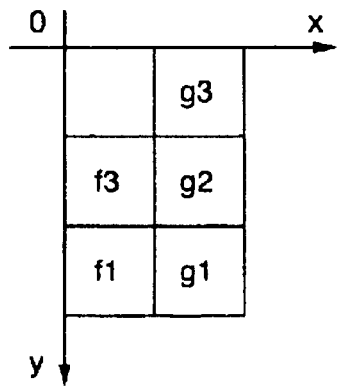
FIG. 17C
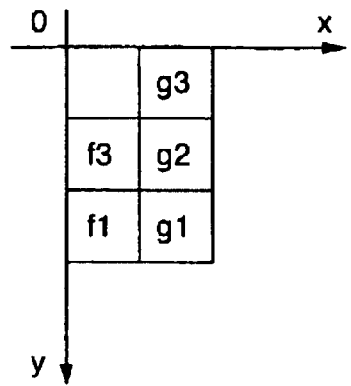
FIG. 18A
```
f1 : ( 0,26) 14 13
f3 : ( 0,13) 14 13
g1 : (14,26) 13 14
g2 : (14,13) 13 14
g3 : (14, 0) 13 14
```
FIG. 18B
```
f1 : ( 0,24) 15 12
f3 : ( 0,12) 15 12
g1 : (15,24) 12 15
g2 : (15,12) 12 15
g3 : (15, 0) 12 12
```
FIG. 18C
```
f1 : ( 0,20) 12 10
f3 : ( 0,10) 12 10
g1 : (12,20) 10 12
g2 : (12,10) 10 12
g3 : (12, 0) 10 12
```

FIG. 19A

| CLASSIFICATION | SPECIFICATION | EXPLANATION |
|---|---|---|
| BLOCK MOVEMENT RULE | remove | MOVEMENT SPECIFICATION OF ANOTHER BLOCK WHEN CERTAIN BLOCK IS REMOVED<br>EXAMPLE : remove: f2→f3: left |
| | add | MOVEMENT SPECIFICATION OF ANOTHER BLOCK WHEN CERTAIN BLOCK IS ADDED<br>EXAMPLE : add: f2→f3: right |
| BLOCK ALLOCATION RULE | group | SPECIFICATION OF GROUP OF BLOCKS TO BE ALLOCATED IN THE NEIGHBORHOOD<br>EXAMPLE : group : g1, g2 |
| | datapath | SPECIFICATION OF GROUP OF BLOCKS AS DATA PATH<br>EXAMPLE : datapath: g2, g3, g4, g5 |
| PERIPHERAL CIRCUIT i / f INFORMATION | i / f | SPECIFICATION OF BLOCK TO BE ALLOCATED IN THE VICINITY OF EXTERNAL CIRCUIT abc<br>EXAMPLE : i / f : RAM: g5 |

FIG. 19B

| CLASSIFICATION | SPECIFICATION | EXPLANATION |
|---|---|---|
| USER'S SPECIFICATIONS INPUT | place | SPECIFICATION OF ALLOCATION PLACE IN OVERALL FLOORPLAN<br>EXAMPLE : place : (0, 0) |
| | density | SPECIFICATION OF AREAL RATIO<br>EXAMPLE : density : 0.5 |
| | aspect | SPECIFICATION OF RATIO BETWEEN VERTICAL AND HORIZONTAL LENGTHS<br>EXAMPLE : aspect 1.2 1.0 |
| | remove | SPECIFICATION OF BLOCK TO BE REMOVED<br>EXAMPLE : remove : f1 |
| | add | SPECIFICATION OF BLOCK TO BE ADDED<br>EXAMPLE : add : g2 |
| | pri | SPECIFICATION OF AREA PRIORITY OR SPEED PRIORUTY<br>EXAMPLE : pri : space or pri : speed |
| | i / f | SPECIFICATION OF i / f FOR PERIPHERAL CIRCUIT<br>EXAMPLE : i / f : RAM : (100, 0) |
| | dp-direction | SPECIFICATION OF DIRECTION OF DATA PATH<br>EXAMPLE : dp-direction : vertical or dp-direction: horizontal |

| BLOCK NAME | IMPORTANCE DEGREE | TEST INPUT | OUTPUT EXPECTATION VALUE |
|---|---|---|---|
| f1,f2 | 1 | test1.in | test1.exp |
| f1,f2 | 2 | test2.in | test2.exp |
| f1,f2 | 3 | test3.in | test3.exp |
| f3 | 1 | test4.in | test4.exp |
| f3 | 2 | test5.in | test5.exp |
| g1,g2,g3 | 1 | test6.in | test6.exp |

INFORMATION PROCESSING APPARATUS, INFORMATION PROCESSING SYSTEM, AND STORAGE MEDIA

BACKGROUND OF THE INVENTION

The present invention relates to design of a semiconductor integrated circuit.

Conventionally, a semiconductor integrated circuit is designed by a designer through an interactive operation using a terminal device.

JP-A-10-79436 describes such a technology of the prior art in which an allocation state of blocks is displayed on a display according to allocation information of blocks stored in a storage, and blocks indicated from an input device are interactively allocated and moved.

JP-A-9-330350 describes an apparatus in which when a circuit including a plurality of elements are arranged in a predetermined mounting area to draw a layout thereof, the elements are allocated to reflect a relative positional relationship among the elements on the circuit diagram. Namely, during the execution of an allocation search of elements in an algorithm or in a heuristic method, a user interactively intervenes in the search so that the searching ability of the algorithm or heuristics and the empirical knowledge or judging ability of the user interact with each other. Thereby, it is possible to obtain the allocation results with high quality in a short period of time.

With advance of technology, the number of gates to be integrated in one chip is increasing. Therefore, it is almost difficult to design again all logical circuits to be integrated because of a large amount of human power required for the design and verification of the integrated circuit. In order to reduce the number of designing steps in the designing of a large scale integrated circuit (LSI), there has been increasingly employed an idea of re-use of design. That is, "the new designing steps are minimized by configuring an LSI with a plurality of blocks for which the existing blocks already designed are used, if possible". A block for which an existing block is used is called as "a virtual component (VC)", "an intellectual property (IP)", or "a core".

By reusing the existing blocks, some of blocks constituting a certain LSI are added to the blocks of an LSI, so that it is possible to easily construct the LSI capable of achieving a required function.

However, any LSI having a predetermined function cannot be necessarily manufactured by such a simple addition and removal of the existing blocks.

The allocation of blocks constituting an LSI is determined by a floorplan which is the allocation information of blocks. The designer defines the circuit description to determine the functions of blocks constituting the LSI. Namely, the characteristics of blocks are determined according to the circuit description. Usually, the designer defines the floorplan together with the block circuit description.

Consequently, when the floorplan is modified through the removal and addition of the blocks without paying attention to the circuit description and by ignoring the characteristics of blocks, a resultant LSI may not satisfactorily function in some cases.

In JP-A-10-79436, a floorplan is interactively edited, so that the designer must generate the floorplan in order that the LSI can satisfactorily function.

JP-A-9-330350 describes a floorplan at a level of elements of an LSI, but consideration has not been given to a floorplan of blocks. Moreover, in order to generate a floorplan, it is required to intervene in the interactive operation of the user so that the empirical knowledge or judging ability of the operator of the tool and the processing of the tool must interact with each other.

That is, when the floorplan is modified in the prior art, it is necessary for the user to have the knowledge at the level of the designer.

SUMMARY OF THE INVENTION

It is therefore an object of the present invention to provide an information processing apparatus for modifying a floorplan in which an LSI is not deteriorated in performance even if a user has not the knowledge of a designer, thereby solving the problem above.

The object will be achieved according to the present invention as follows. A designer of a semiconductor integrated circuit beforehand generates circuit information for indicating functions of blocks constituting the semiconductor integrated circuit, and a floorplan regarding allocation of the blocks. The circuit information and the floorplan are stored with being associated with evaluation indices for evaluating modification of the floorplan.

Thereby, when a user modifies the floorplan, the user can evaluate the modified floorplan according to the evaluation indices. Namely, the user can modify the floorplan without deteriorating the performance of the LSI even if the user has no know-how of the designer.

The objects and features of the present invention will become more apparent from the consideration of the following detailed description taken in conjunction with the accompanying drawings.

BRIEF DESCRIPTION OF THE DRAWINGS

FIG. 2 is a flowchart showing a processing of a circuit design;

FIGS. 3A–3D are diagrams showing floorplans generated through the circuit design;

FIG. 4 is a diagram showing examples of evaluation indices and evaluation weights, respectively;

FIGS. 9A–9I are diagrams for explaining a block movement processing and a block allocation evaluation processing shown in FIG. 8;

FIGS. 10A–10G are diagrams showing a block movement processing shown in FIG. 8;

FIG. 11 is a flowchart showing a floorplan modification processing shown in FIG. 6;

FIGS. 14A–14C are diagrams for explaining the rotated image generation processing;

FIGS. 15A–15E are diagrams for explaining the inverted image generation processing;

FIGS. 16A–16D are diagrams for explaining the inverted image generation processing;

FIGS. 17A–17C are diagrams for explaining an aspect ratio (between vertical and horizontal lengths) modification processing and an area modification processing shown in FIG. 10;

FIGS. 18A–18C are diagrams for explaining the aspect ratio modification processing and the area modification processing shown in FIG. 10;

FIGS. 19A and 19B are diagrams showing a list of block allocation information as the know-how of the designer and a list of the user's specifications;

DESCRIPTION OF THE PREFERRED EMBODIMENTS

Figure 1A:
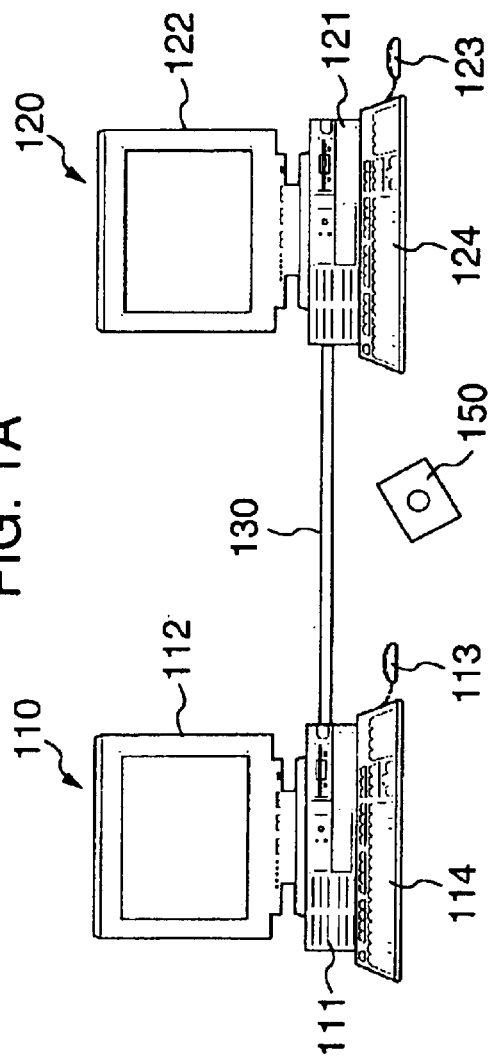
FIGS. 1A–1C are diagrams showing constitution of an information processing system according to the present invention.

Referring now to the drawings, description will be given on embodiments of the present invention.

Figure 20:
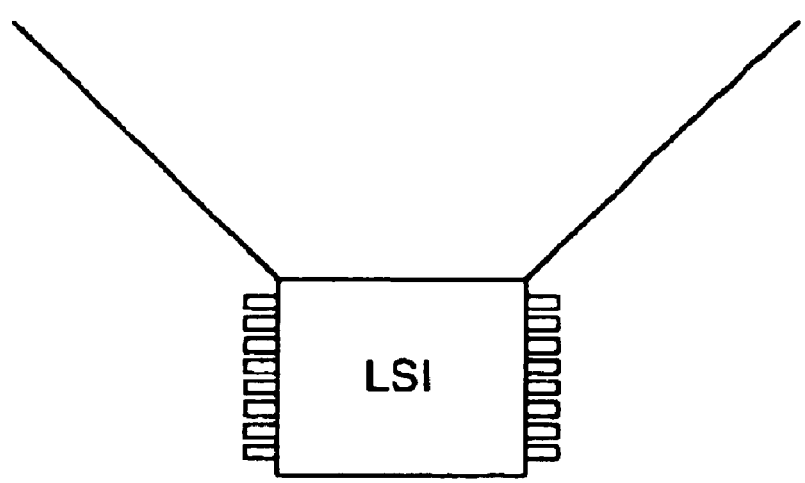
FIG. 20 is a diagram showing a configuration of an LSI.
Figure 21:
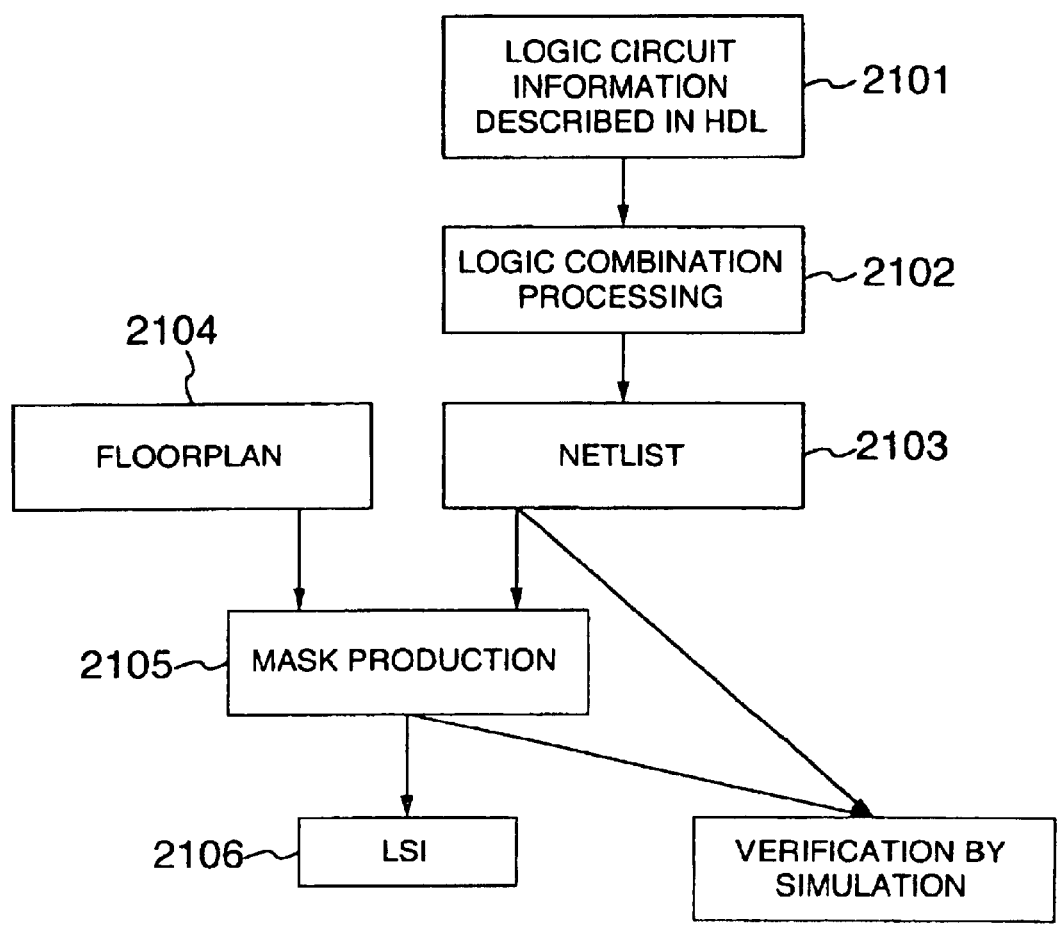
FIG. 21 is a diagram showing an LSI design/manufacture process.

FIG. 21 shows an LSI design/manufacture process. In the LSI design, each of LSI units such as a central processing unit (CPU), a communication controller and a signal processing device shown in FIG. 20 is called as a function module 2001, and a minimum unit constituting the function module 2001 is called as a block. The block corresponds to a multiplier or register of the CPU, for example.

In the LSI design, logic circuit information is inputted in a block unit in a hardware description language (HDL) which is higher in an abstraction level than a description at a level of the element or gate, for example (step 2101). Then, the logic circuit information is processed by a logic synthesis tool (step 2102) to produce AND gates and OR gates which constituent a block, and a netlist which is connection information of the AND gates and OR gates (step 2103).

Then, a floorplan which is allocation information of blocks constituting the module is generated (step 2104). According to the floorplan and the netlist, a mask of the LSI is produced (step 2105). Thereafter, the LSI is manufactured using the mask (step 2106).

FIG. 1A shows an overall configuration of a circuit design support system to generate the netlist and floorplan shown in FIG. 20. The circuit design support system includes a circuit designing apparatus 110 for generating the floorplan and netlist which a designer uses to design the LSI, and a floorplan modifying apparatus 120 by which a user who manufactures the LSI modifies the floorplan generated in the circuit designing apparatus 110 to generate a new floorplan. The circuit designing apparatus 110 and the floorplan modifying apparatus 120 are connected via a network 130 to each other.

Figure 1C:
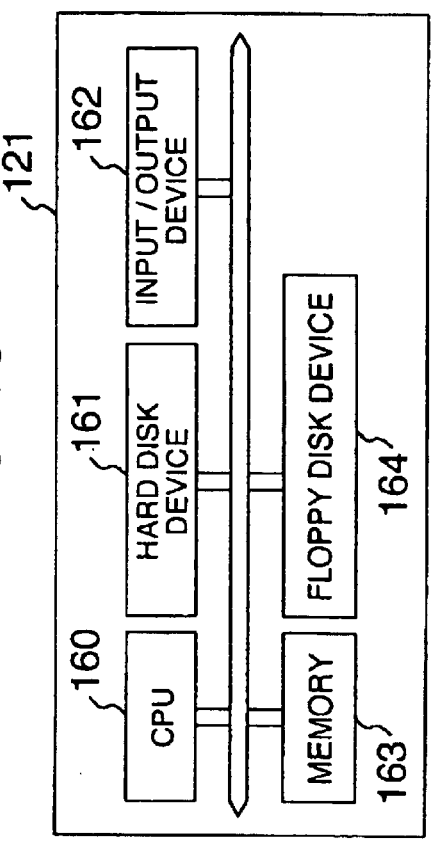
Figure 1B:
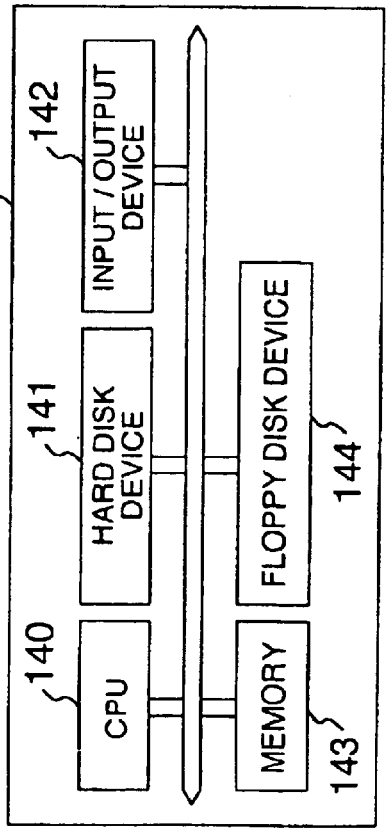

The circuit designing apparatus 110 includes a main body 111, a display 112, a mouse 113 and a keyboard 114. As shown in FIG. 1B, the main body 111 includes a CPU 140 for executing a program, a hard disk device 141, an input/output device 142 connected to the mouse 113, the keyboard 114 or the network, a memory 143 for temporarily storing data when the CPU executes the program, and a floppy disk device 144 for writing and reading data on and from a floppy disk.

FIG. 2 shows the processing when the designer performs the circuit design using the circuit designing apparatus 110. The circuit design processing is stored in the form of a program in the hard disk device 141 of the apparatus 110.

After the CPU 140 of the circuit designing apparatus 110 executes the program, the designer first inputs the logic circuit information (step 201). The logic circuit information is inputted in the hardware description language for each block of the function module using the display 112, the mouse 113 and the keyboard 114. Then, the designer interactively executes a floorplanner stored on the hard disk, and determines allocation of the blocks in the module to generate several floorplans (step 202). The reason why the several floorplans are generated is to manufacture the LSI corresponding to the use and purpose as a floorplan for minimizing the area of LSI and a floorplan for increasing the operation speed of LSI, for example. FIGS. 3A–3D show examples of the generated floorplans. FIGS. 3A and 3B show the outlines of the floorplans, and FIGS. 3C and 3D show the definitions of the respective floorplans. The floorplan shown in FIGS. 3A and 3C is generated by giving the priority to the processing speed, and the floorplan shown in FIGS. 3B and 3D is generated by giving the priority to the minimization of area. The priority item and the allocation information of blocks are defined for each floorplan. The priority item is defined after "pri". The priority item of the processing speed priority is defined as "speed". The priority item of the area priority is defined as "space". The allocation information of blocks includes a block name, reference coordinates of a block, a block width and a block height. The block reference coordinates are defined according to the gravity center of the block and the vertex of the block. In the embodiment, the upper-left vertex of the block is specified as the reference coordinates. As a result, for block f1 shown in FIG. 3B, the reference coordinates are positioned at position (0, 0), the width is "13", and the height is "14", according to FIG. 3D.

Then, the designer inputs the evaluation indices and the evaluation weights (steps 203 and 204). The evaluation indices and the evaluation weights are used when the user modifies the floorplan generated by the designer. The floorplan is generated in consideration of the logic circuit information inputted by the designer. When the user who manufactures the LSI without understanding the contents of the logic circuit information modifies the floorplan, the performance of the LSI may be deteriorated in some cases.

Hence, in order not to deteriorate the performance of the finally manufactured LSI even if the user modifies the floorplan in such a manner, it is desired that the modified floorplan can be evaluated according to the evaluation indices and the evaluation weights. The evaluation of the floorplan by the evaluation indices and the evaluation weights will be described later.

The designer inputs the evaluation indices and the evaluation weights for preventing the deterioration of LSI performance using the display 112 and the keyboard 114.

FIG. 19A shows a list of the evaluation indices available for the designer. The evaluation indices include a block movement rule which is an evaluation index concerned with the movement of the block in the module, a block allocation rule which is an evaluation index concerned with the allocation of the block, and the peripheral circuit i/f information.

The block movement rule includes specification "remove" and specification "add".

Specification "remove" is used to evaluate the movement of another block when a certain block is removed. Specification "remove: f2→f3: left" indicates that the performance is not deteriorated by moving block f3 left when block f2 is removed.

Specification "add" is used to evaluate the movement of another block when a certain block is added. Specification "add: f2→f3: left" means that the performance is not deteriorated by moving block f3 left when block f2 is added.

The block allocation rule includes specification "group" and specification "datapath".

Specification "group" is used to evaluate a group of blocks to be allocated in the neighborhood. Specification "group: g1, g2" indicates that the performance is not deteriorated by allocating block g1 and block g2 adjacent to each other.

Specification "datapath" is used to specify a group of blocks as a data path. Specification "datapath: g2, g3, g4, g5" means that a data path exists among block g2, block g3, block g4 and block g5, and that the performance is not deteriorated by allocating blocks g2 to g5 are adjacent to each other.

The peripheral circuit i/f information is used to evaluate a block or an input/output port to be placed in the vicinity of an external circuit. Specification "if: RAM: g5" indicates that a random-access memory (RAM) is provided as the external circuit, and that the performance is not deteriorated by placing block g5 in the vicinity of the RAM.

FIG. 4(*a*) shows an example of the evaluation indices inputted by the designer. The designer inputs "datapath", "group", "i/f", and "remove" as the evaluation indices.

FIG. 4(*b*) shows the evaluation weights inputted by the designer.

The logic circuit information, floorplans, evaluation indices and evaluation weights which are generated by the designer are stored in the hard disk device 141 with being associated with each other. The logic circuit information, floorplans, evaluation indices and evaluation weights stored in the hard disk device 141 may be used in another apparatus by being stored on a floppy disk or via a network.

Figure 5:
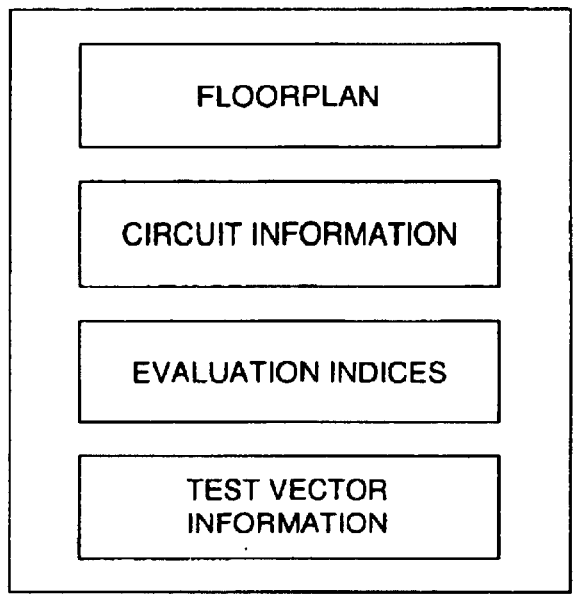
FIG. 5 is a diagram showing information stored on a storage media.

FIG. 5 shows a state in which the logic circuit information, at least one floorplan, the evaluation indices and the evaluation weights are stored on the floppy disk. It is possible to modify the floorplan in another apparatus by storing on the floppy disk the evaluation indices and evaluation weights which are inputted according to the know-how of the operator.

Description will next be given on the floorplan modifying apparatus 120 shown in FIG. 1A.

The floorplan modifying apparatus 120 includes a main body 121, a display 122, a mouse 123 and a keyboard 124. As shown in Fig. 1C, the main body 121 includes a CPU 160 for executing a program; a hard disk device 161; an input/output device 162 connected to the mouse 123, the keyboard 124 or a network 130; a memory 163 for temporarily storing data when the CPU executes the program; and a floppy disk device 164 for writing and reading data on and from a floppy disk.

The user modifies the floorplan, which the designer generates using the display 122, the mouse 123 and the keyboard 124, using the floorplan modifying apparatus 120 to generate a new floorplan. The user may also generate another floorplan from the generated new floorplan.

In the floorplan modification, when the floorplan to be modified is missing in the floorplan modifying apparatus 120, the user acquires the floorplan, the evaluation indices, the evaluation weights and the logic circuit information from the floppy disk 150 or via the network 130 to store them in the hard disk device 161.

Figure 6:
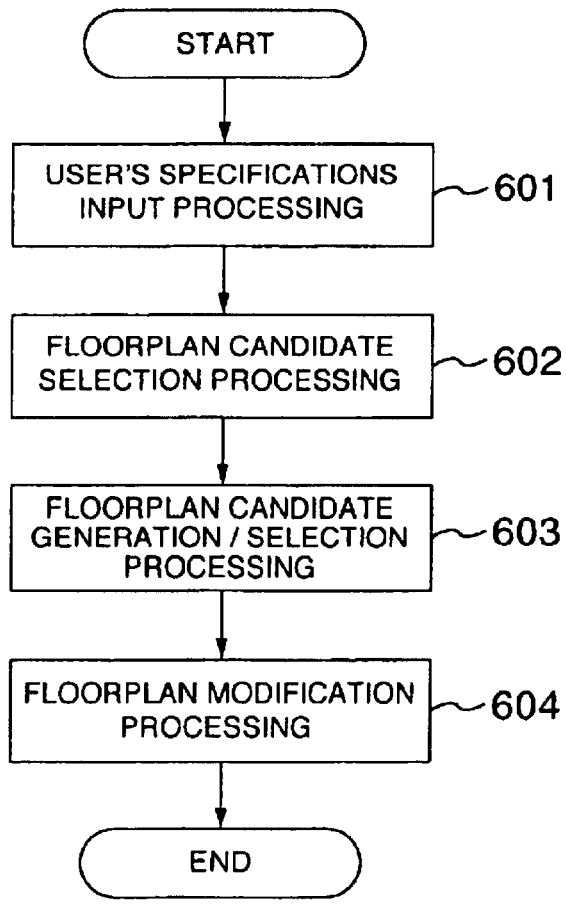
FIG. 6 is a flowchart showing an overall processing of modifying a floorplan.

FIG. 6 shows a flowchart for modifying the floorplan in the floorplan modifying apparatus 120. The flowchart is stored as a floorplan modifying program in the hard disk device 161 of the floorplan modifying apparatus 120. When the user inputs an instruction from the keyboard 124, the program is read out and is executed by the CPU 160.

When the program is started by the CPU 160, the user inputs from the keyboard 124 the specifications for modifying the floorplan (step 601). When the specifications are completely inputted by the user, one of the floorplans is selected from the hard disk device 161 according to the specifications (step 602). The removal and addition of block in the specifications inputted by the user are executed according to the selected floorplan to generate several floorplans. The evaluation indices and the evaluation weights are read out from the hard disk device 161 to evaluate the generated floorplans. One of the generated floorplans having the lowest evaluation value is selected (step 603). Finally, the floorplan is modified according to the rest of the user's specifications (i.e., the specifications other than the removal and addition) to generate a new floorplan and store it in the hard disk device 161 (step 604).

The floorplan thus generated is used together with the logic circuit information to produce a mask of the LSI.

Description will now be given in detail on the operation of the floorplan modifying apparatus 120 shown in FIG. 6.

When the floorplan modifying program is started, a screen image for inputting the user's specifications is displayed on the display 122. The user inputs the specifications using the keyboard 124 or the mouse 123 (step 601).

FIG. 19B is a list of the specifications inputted by the user. The items which can be specified as the user's specifications are "place", "density", "aspect", "remove", "add", "pri", "i/f" and "dp-direction".

Item "place" is used to specify the reference coordinates for a floorplan modification processing. Description "place: (0, 0)" indicates that (0, 0) is used as a reference position to set the floorplan. Details of "place: (0, 0)" will be described later.

Item "density" is used to specify the ratio of the area. Description "density: 0.5" means that the size of an original floorplan is multiplied by 0.5.

Item "aspect" is used to specify the aspect ratio of a floorplan. Description "aspect: 1.2, 1.0" means that the vertical and horizontal lengths of the original floorplan are multiplied by 1.2 and 1.0, respectively.

Item "remove" is used to specify a block to be removed. Description of "remove: f1" instructs to remove block f1 of a floorplan.

Item "add" is used to specify a block to be added. Description "add: g2" indicates that block g2 is added to a floorplan.

Item "pri" is used to specify an item having the priority in the floorplan generation. Description "pri: space" indicates that a floorplan with priority assigned to the area is selected from a plurality of floorplans. Another item for the priority is "speed" associated with the processing speed. However, the user or designer may specify any other item with the priority.

Item "i/f" is used to specify information about a peripheral circuit. Description "i/f: RAM: (100, 0)" instructs to allocate a port for being connected to the RAM at position (100, 0).

Item "dp-direction" is used to specify the direction of data path. Description "dp-direction: horizontal" means that a block is allocated so as that the data path in the floorplan is provided in the horizontal direction. There is also the vertical direction as the direction of data path, which is specified by "de-direction: vertical".

Figures 7, 8:
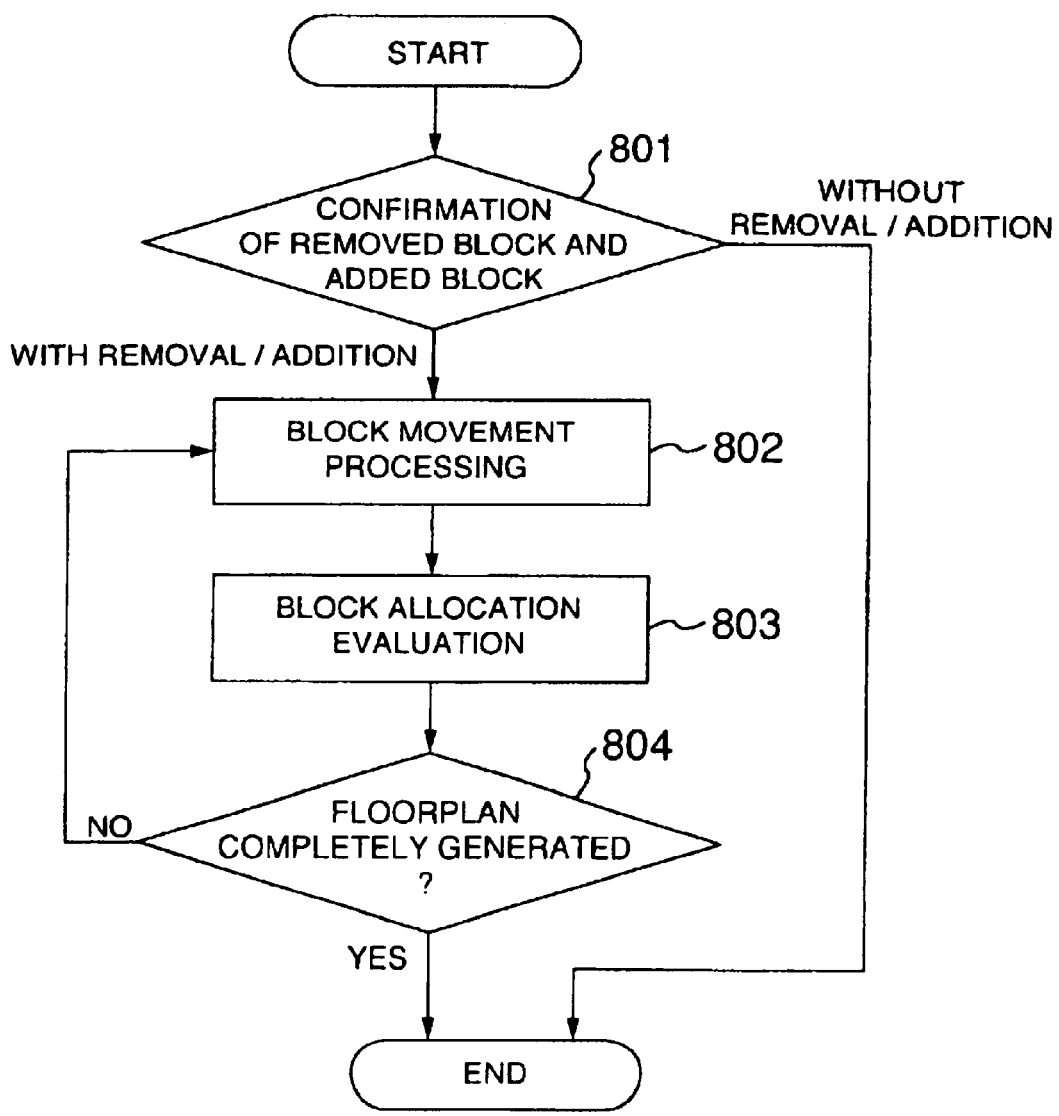
FIG. 7 is a diagram showing an example of user's specifications.
FIG. 8 is a flowchart showing a floorplan candidate generation/selection processing for the floorplan shown in FIG. 6.

FIG. 7 shows an example of the specifications inputted by the user. The user specifies the specifications of the floorplan with seven items "place", "density", "aspect", "remove", "pri", "i/f" and "dp-direction".

The floorplan stored in the hard disk device 161 is selected according to the specifications (step 602). Namely, the floorplan stored in the hard disk device 161 with the priority item described in "pri", which matches with that described in "pri" of the user's specifications, is selected. Each of the floorplans stored in the hard disk device 161 has the priority item described after "pri" as shown in FIG. 3. Item "space" is described after "pri" in FIG. 7, so that the floorplan shown in FIGS. 3B and 3D in which "space" is described is selected.

For the floorplan thus selected, the block addition/removal processing described in the user's specifications is executed to generate several floorplans (step 603). FIG. 8 shows the floorplan candidate generation/selection processing.

First, it is checked whether or not "remove" or "add" for removing or adding a block is described in the user's specifications (step 801). When "remove" is found in the user's specifications, the associated block is removed. When "add" is found in the user's specifications, the associated block is added at the predetermined location.

For the floorplan in which the block is removed or added according to the user's specifications, the evaluation value of floorplan is obtained based on the evaluation indices and the evaluation weights (step 803).

Then, for the floorplan in which the block is removed or added according to the user's specifications, the movement among the blocks is performed to generate a new floorplan (step 802). For the generated floorplan, the evaluation value of floorplan is obtained based on the evaluation indices and the evaluation weights (step 803). The evaluation value of floorplan obtained by the block movement is compared with that of the floorplan for which the block is removed or added according to the user's specifications to select one with the lower evaluation value as a candidate (step 804). Then, another block movement is performed to generate a floorplan (step 802) to obtain the evaluation value for floorplan based on the evaluation indices and the evaluation weights (step 803). The obtained evaluation value is compared with that of the floorplan selected as the candidate to select one with the lower evaluation value as a new candidate (step 804). The above processes are repeated to determine the floorplan with the lowest evaluation value according to the block movement as the floorplan candidate.

Referring now to FIGS. 9A–9I, description will be given on the block movement of the blocks constituting the floorplan, and the evaluation value.

FIG. 9A shows the evaluation indices and evaluation weights of the designer shown in FIGS. 4A and 4B. FIG. 9B shows the user specifications shown in FIG. 7. FIG. 9C shows the floorplan selected from the hard disk device 161 according to priority item "space" described after "pri" in the user's specifications. Description will now be given on the block movement. Item "remove" is described in the user's specifications (FIG. 9B). A floorplan in which block f2 is removed from the floorplan shown in FIG. 9C is generated based on the item as shown in FIG. 9D. The block movement is to move the blocks, which constitute the generated floorplan (FIG. 9D), based on the predetermined rule. In the movement rule of floorplan shown in FIGS. 9A–9I, another block (f1, f3, g1, g2 or g3) is allocated to the portion from which block f2 is removed according to "remove". For example, block g2 of the floorplan shown in FIG. 9D is moved to generate a floorplan shown in FIG. 9E. Similarly, new floorplans shown in FIGS. 9F–9I can be generated.

FIGS. 10A–10G show the block movement when a new block is added. Fig. 10A shows a floorplan in which new block f4 is added to the floorplan selected according to priority item "pri: space" described in the user's specifications.

Here, the block movement is performed on the assumption that the floorplan is the form of a rectangle. That is, the floorplan which is drawn by bold lines is assumed so as to include a portion in which new block f4 is added and to form a rectangle. The portion shadowed in the floorplan is an empty area. The floorplans shown in FIGS. 10B–10G are generated by moving blocks f1–f3 and g1–g3 so as to fill up the empty area.

Description will next be given when the block removal and addition is performed. When the number of the removed blocks exceeds that of the added blocks, a new floorplan is generated in the same processing as when the block is simply removed. When the number of the added blocks exceeds that of the removed blocks, a new floorplan is generated in the same processing as when the block is simply added.

When the number of the removed blocks is equal to that of the added blocks, the block movement is performed for all possible blocks.

Here, when the number of the blocks in the floorplan exceeds that of the shown blocks, the block movement mentioned above requires quite a large amount of computation steps in some cases. A high-performance CPU may execute the computation at once. However, a long period of time may be required for a CPU with low performance to obtain the result. To cope with the difficulty, it is only necessary to beforehand determine the number of the floorplans to be generated, so that the computation stops when the predetermined number of the floorplans are generated.

Description will now be given on the evaluation value. The evaluation value is obtained using the evaluation indices and the evaluation weights. Here, as shown in FIG. 9A, the evaluation indices and the evaluation weights are defined as follows: "datapath: f1, f2, f3" with a weight value of 100; "group: f1, g1" with a weight value of 1; "group: g2, g3" with a weight value of 1; and "remove: f2→f3: left" with a weight value of 1.

Therefore, the evaluation value is computed as follows.

Evaluation value=(Number of data path rule violations×100)+ {(Distance between group *f*1 and group *g*1)×1}+{(Distance between group *g*2 and group *g*3)×1}+(Number of remove violations×1)

"Number of data path violations" indicates the number of the violations against the defined "data path: f1, f2, f3". That is, when blocks f1, f2, f3 are separately allocated so that any other blocks are inserted among these blocks, the violations occurs. Consequently, the violations occur in the block allocation f1, g2 and f3 and the block allocation f2, g3 and f3.

In the embodiment, block f2 is removed according to "remove: f2→f3: left", so that it is checked whether or not the violation occurs between block f1 and block f3.

"Distance between groups" is the distance between the reference coordinates of the blocks. As shown in FIG. 3, the reference coordinates are used to define the floorplan. When block f1 and block f2 have the reference coordinates specified as f1(X1, Y1) and f2(X2, Y2), respectively, the distance between the blocks is obtained as $((X1-X2)^2 +(Y1-Y2)^2)^{1/2}$. The reference coordinates are sequentially updated when the blocks are moved. "Number of remove violations" indicates the number of the remove violations in other blocks associated with the removal of a block specified by "remove". Specification "remove: f2: f3 left" is described in FIG. 9A, so that block f2 is removed and then block f3 is moved left. That is, block f2 is removed from the floorplan shown in FIG. 9C, and then block f3 is moved left, i.e., block f3 moves to the area of block f2. In FIG. 9E, block g2 is allocated to the area of block f2, and block f3 is not moved left. Therefore, in FIG. 9E, the number of the remove violations is "1".

The evaluation value in FIG. 9E is obtained as follows.

Evaluation value = (Number of data path rule violations × 100) +

{(Distance between group $f1$ and group $g1$) × 1} +

{(Distance between group $g2$ and group $g3$) × 1} +

(Number of remove violations × 1)

= (1 × 100) + ((10 + 14) × 1) + (1 × 1)

= 125

The evaluation values can be similarly obtained for the floorplans shown in FIGS. 9D, 9F–9I. The obtained evaluation values are shown in these diagrams.

When the obtained evaluation values are compared with each other, the floorplan shown in FIG. 9F takes the minimum value, so that this floorplan is determined as the floorplan candidate.

In the processing shown in FIG. 8, when neither "remove" nor "add" is described (step 801), the processing is terminated. In short, in association with the user's modification, the performance of the LSI finally manufactured is most influenced by the allocation modification of blocks. Consequently, when neither "remove" nor "add" is described, the processing is terminated without obtaining any evaluation value. In this situation, the floorplan selected by "pri" in the user's specifications becomes the floorplan candidate.

Figure 23:
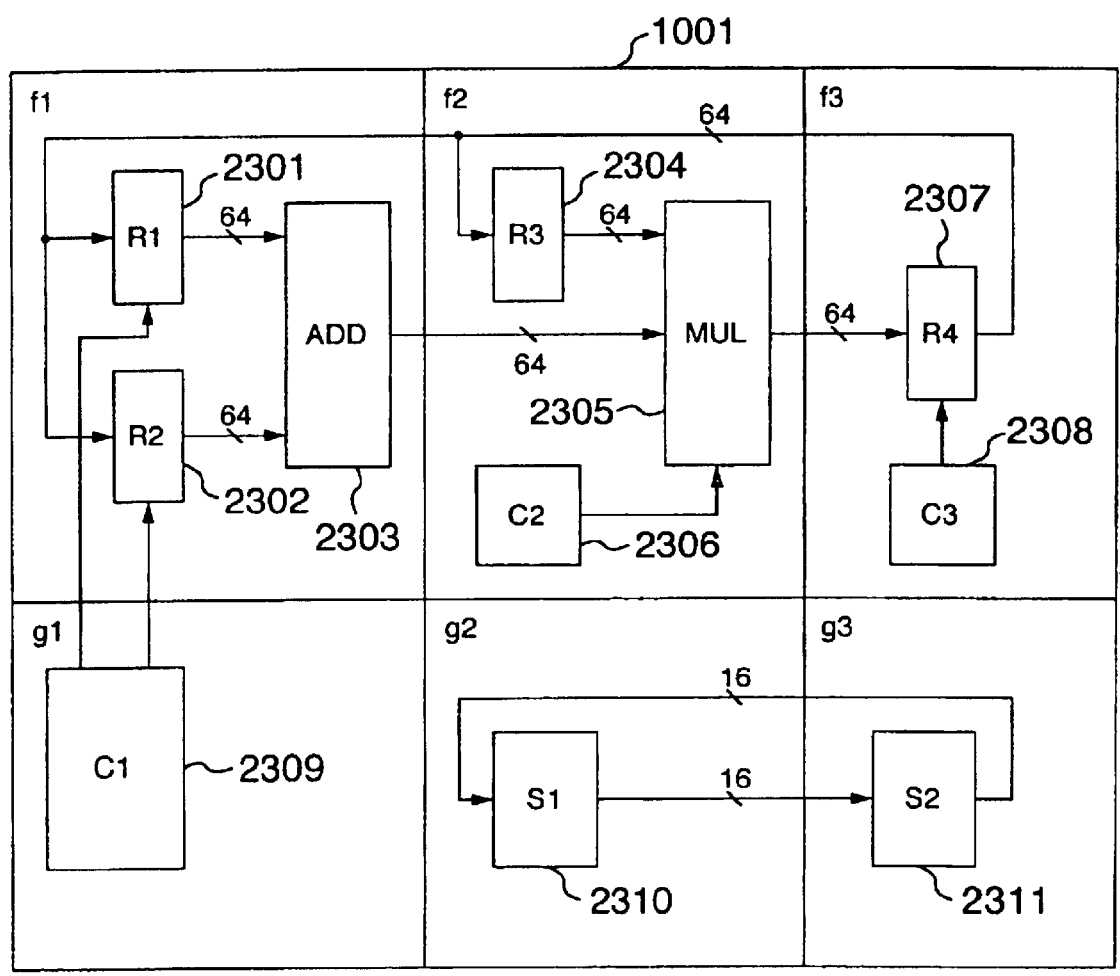
FIG. 23 is a diagram showing an example of circuits associated with the evaluation indices and evaluation weights of the designer shown in FIG. 9A.

Referring next to FIG. 23, description will be given on an example of a circuit associated with the evaluation indices and evaluation weights of the designer shown in FIG. 9A. The circuit shown in FIG. 23 includes registers 2301, 2302, 2304, 2307, an adder 2303, a multiplier 2305, register controllers 2306, 2308, 2309, and finite state machines 2310, 2311.

Each of the registers 2301, 2302 stores the output signal of the register 2307 at timing indicated by the register controller 2309. The register 2304 stores the output signal of the register 2307 at timing indicated by the register controller 2306. The adder 2303 adds the output signals of the registers 2301, 2302 to output the output signal thereof on an output signal line. The multiplier 2305 multiplies the output signal of the adder 2303 by data outputted from the register 2304 to output the output signal thereof on an output signal line. The register 2307 stores data on an input signal line thereof at timing indicated by the register controller 2308. The finite state machines 2310, 1211 execute the processing with communicating data and control signals with each other. The finite state machine 2311 communicates data with an external RAM via a signal line (not shown).

Each of the registers 2301, 2302, 2304, 2307, the adder 2303 and the multiplier 2305 has 64 output signal lines, and each of the finite state machines 2310, 1211 has 16 output signal lines.

Each of blocks f1, f2, f3 has a data path in the horizontal direction. In consequence, the horizontal and successive arrangement of these blocks will expectedly facilitate the allocation and wiring and increase the operating frequency. Block g1 has a control signal line output to block f1, so that they are preferably placed near to each other. Block g2 and block g3 communicate signals with each other via signal lines, so that they are preferably placed near to each other. When the user who does not require any multiplier specifies the removal of the multiplier in the user's specifications, block f3 is preferably moved left in relation to the data path. The properties of these logic circuits are the knowledge of the designer in the design phase or the knowledge obtained through the analyses using the design tools or the like after the design phase. These properties are specified as the evaluation indices and evaluation weights of the designer shown in FIG. 9A.

Next, the floorplan candidate is modified according to the user's specifications other than the block removal and addition (step 604).

FIG. 11 shows the floorplan modification processing (step 604).

For the floorplan candidate, the floorplan is rotated according to "datapath" of the user's specifications to generate a rotated image (step 1101). Then, an inverted image is generated by inverting the floorplan in the vertical and horizontal directions according to "i/f" which is the connection information to the peripheral circuit (step 1102). Then, the aspect ratio of the floorplan is modified according to "aspect" (step 1103). Finally, the entire area of the floorplan is determined according to "density" (step 1104).

Figure 12B:
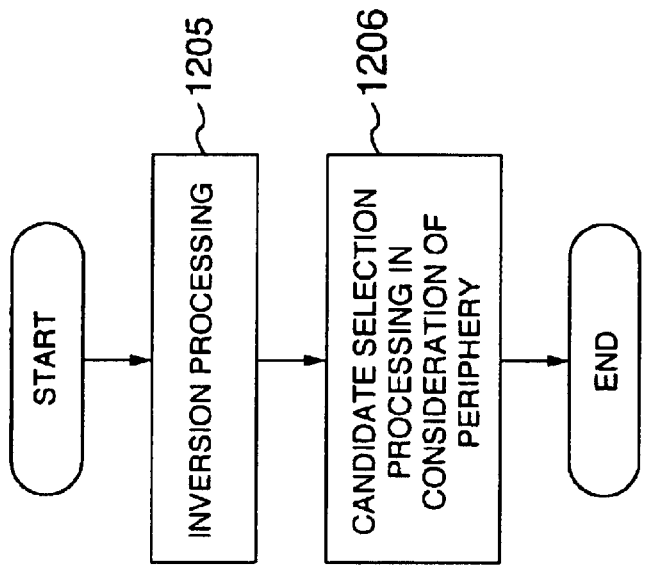
FIGS. 12A and 12B are flowcharts showing a rotated image generation processing and an inverted image generation processing shown in FIG. 10.
Figure 12A:
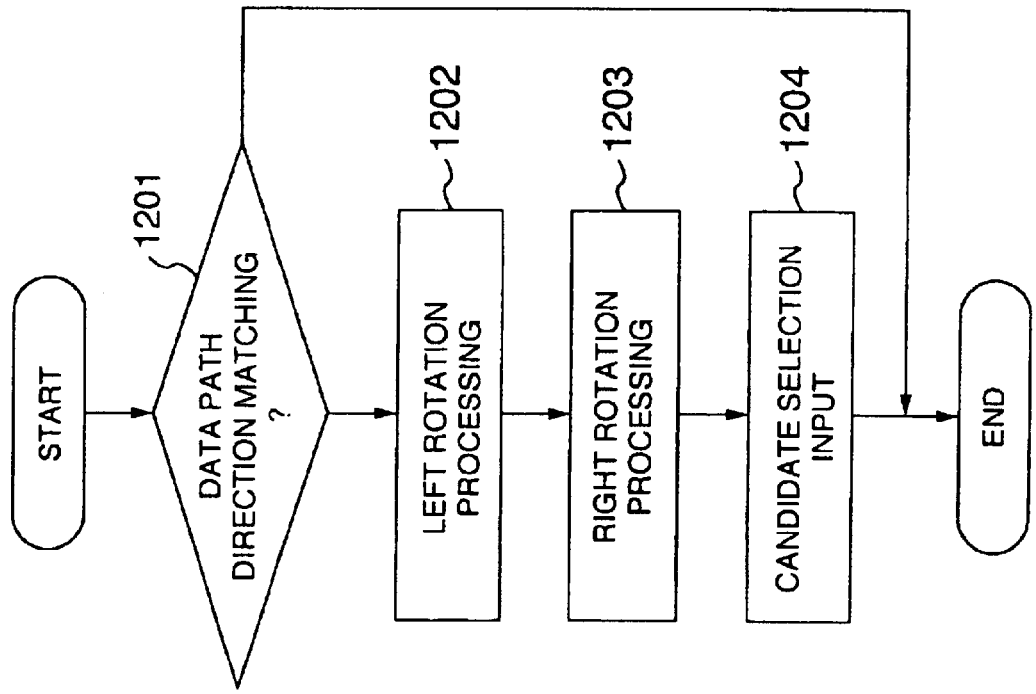

FIG. 12A shows the inverted image generation processing (step 1101) of the floorplan according to "datapath" of the user's specifications.

First, the direction of the data path specified by the user and the direction of the data path of the floorplan determined as the candidate in the block addition/removal processing (step 1201) are checked. The direction of the data path of the target floorplan is determined based on "datapath" which is one of the evaluation indices defined by the designer.

Specifically, the direction of the data path specified by the user is "vertical" as shown in FIG. 9B. Specification "datapath" defined by the designer is "datapath f1 f2 f3" as shown in FIG. 9A. The data path of the floorplan is horizontal due to this and the floorplan candidate. Therefore, the user's specifications and the target floorplan are different in the direction of the data path.

Subsequently, when the direction of the data path specified by the user differs from that of the target floorplan, the target floorplan is rotated left and right to generate a left-rotated image and a right-rotated image, respectively (steps 1202 and 1203).

Figure 13A:
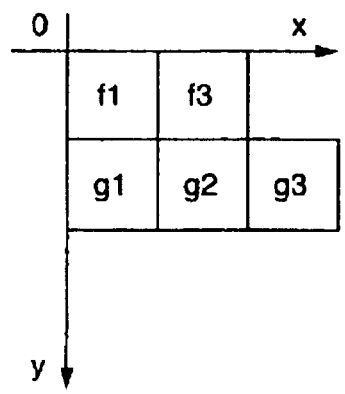
FIGS. 13A–13E are diagrams for explaining the rotated image generation processing.

The rotated images of the floorplan are generated as follows. FIG. 13A shows the floorplan candidate obtained in the block removal/addition processing. FIG. 14A shows the definition of the floorplan. As the floorplan is defined as "place: (0, 0)" by the user in FIG. 9B, the reference (upper-left) point of the floorplan is set to position (0, 0) as shown in FIG. 13A.

Figure 13B:
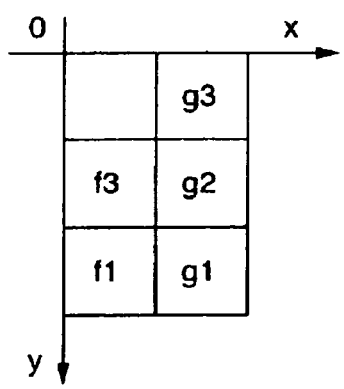
Figure 13C:
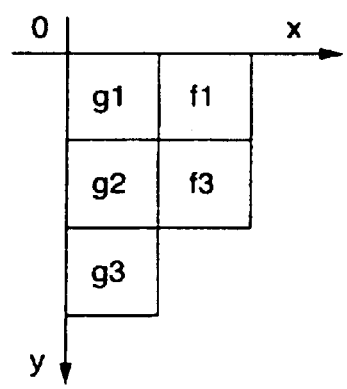
Figure 13D:
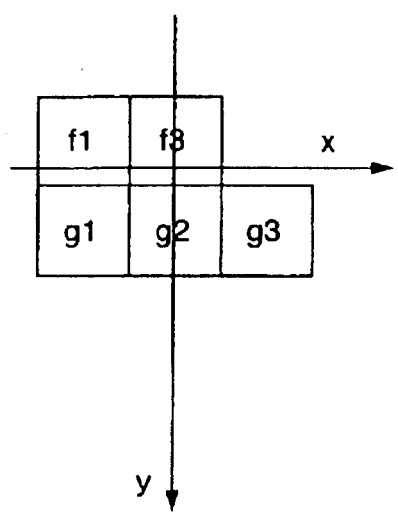
Figure 13E:
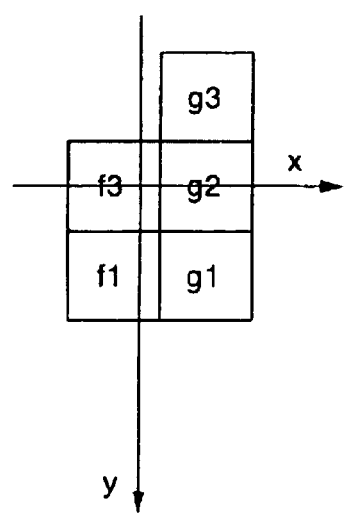

First, the center of gravity of the floorplan is obtained according to the definition of the floorplan shown in FIG. 14A, and then is shifted to the origin (FIG. 13D). The resultant floorplan is rotated 90° left around the origin (FIG. 13E), and then a new reference (upper-left) point is moved to the origin. Thereby, the left-rotated image shown in FIG. 13B is obtained. The right-rotated image (FIG. 13C) of the floorplan can also be generated through the similar rotating steps. In this situation, the definition of the floorplan is modified as shown in FIGS. 14B and 14C.

The floorplan may be determined by comparing the directions of the data paths of the right-rotated and left-rotated floorplans with that of the data path specified by the user. However, when one floorplan includes a plurality of data paths, there may be a data path which does not coincide with the data path specified by the user even when the floorplan is rotated right and left. Therefore, the right-rotated and left-rotated floorplans are displayed on the display 122 so that the user selects the candidate via the keyboard 124 or the mouse 123 (step 1204).

The floorplan thus selected by the user is set as a new floorplan candidate. When the matching condition results from the data path check (step 1201), the floorplan is set as the floorplan candidate.

Description will now be given on the generation of the inverted image of the floorplan.

FIG. 12B shows the inverted image generation processing (1102).

The inversion processing 1205 generates the horizontally inverted image, vertically inverted image and horizontally and vertically inverted image of the current floorplan. FIG. 15A shows the floorplan candidate selected by the user through the rotated image generation processing. FIG. 16A shows the definition of this floorplan. As described above, the upper-left of the floorplan is represented by the reference coordinates when the horizontally inverted image and the vertically inverted image are generated. For the horizontally inverted image, all the signs of X coordinates of the floorplan shown in FIG. 15A are changed to minus (FIG. 15E). Then, the floorplan is moved in parallel in the positive direction of X axis so that the reference point thereof is positioned at the origin to obtain the floorplan shown in FIG. 15B. For the vertically inverted image, all the signs of Y coordinates of the floorplan are changed to minus. Then, the floorplan is moved in parallel in the positive direction of Y axis so that the reference point thereof is positioned at the origin. For the vertically and horizontally inverted image, the vertically inversion processing is performed after the horizontally inversion processing. The definition of the floorplan is also modified in this situation as shown in FIGS. 16B and 16C.

The optimal floorplan is selected from the vertically inverted image, horizontally inverted image and vertically and horizontally inverted image thus generated and the original floorplan in consideration of the peripheral circuit (step 1206). This floorplan selection is performed according to "i/f" specified by the user and "i/f" in the evaluation indices specified by the designer. Description will be given in detail on this floorplan selection.

The user's specifications regarding the peripheral circuit is described by "i/f" as shown in FIG. 9B in which description "i/f: RAM: (100, 0)" means that the allocation coordinates of the RAM is (100, 0) (in FIGS. 15A–15E, a small circle indicates coordinates (100, 0)).

The evaluation indices shown in FIG. 9B includes "i/f: RAM g3" which means that "the RAM has a port in block g3".

Then, for each floorplan, the distance between the central coordinates of block g3 and coordinates (100, 0) of the RAM is obtained. The floorplan having the minimum value of the distance is determined. Among the four floorplans shown in FIGS. 15A–15D, block g3 of the floorplan shown in FIG. 15D is nearest to the RAM, so that this floorplan is selected. The floorplan thus selected is set as the floorplan candidate.

Finally, description will be given on the aspect ratio modification processing and the area modification processing.

FIGS. 17A–17C show the floorplans for which the aspect ratio modification processing 1103 and area modification processing 1104 shown in FIG. 11 are conducted. FIGS. 18A–18C show the definition of the floorplan. The modifications of the aspect ratio and area are used to change the wiring density when the actual LSI is manufactured.

The aspect ratio modification processing is the processing in which the ratio of the horizontal width and height of the block is modified to the integer ratio specified by the user's specifications, on the condition that the area of the block is constant. If it is assumed that the user's specifications is that shown in FIG. 9B and the floorplan shown in FIG. 17A is that before the aspect ration modification processing, the floorplan shown in FIG. 17B is obtained after the aspect ration modification processing.

The area modification processing is the processing in which the area of the floorplan enlarges or minimizes by the value (the value of "density") specified in the user's specifications. When the area modification processing is performed for the floorplan shown in FIG. 17B, the floorplan shown in FIG. 17C is obtained.

The definition of the floorplan is modified to that shown in FIG. 18 due to the aspect ratio modification processing and the area modification processing.

The floorplan obtained by the processing above is stored in the hard disk device 161 of the floorplan modifying apparatus 120. At this point, the evaluation indices, evaluation weights and circuit description information of the designer associated with the original floorplan are associated with the new floorplan. The floorplan, evaluation indices, evaluation weights and circuit description information can be used in other apparatuses via the floppy disk 150 or the network 130.

In the floorplan modifying apparatus 120, a further new floorplan can be generated using the floorplan generation processing based on the floorplan generated by the user.

The user can arbitrarily modify the floorplan without deteriorating the performance of the LSI by providing the floorplan and the know-how of the designer thereof as the evaluation indices.

In the description above, the floorplan, the evaluation indices, the evaluation weights and the circuit description information are communicated via the floppy disk or the network with the other apparatuses. However, the program of the floorplan modification processing shown in FIG. 6 may also be stored on the floppy disk.

In this situation, the user not having any necessary information can acquire the floorplan, the evaluation indices, the evaluation weights, the circuit description information and the floorplan modification program via the floppy disk or the network to freely modify the floorplan.

In the configuration above, the designer can manage the floorplan modification program as well as the floorplan. As described above, there are various modifications as the floorplan modification. However, the designer possibly desires to inhibit some modifications in order to prevent the deterioration of the performance. Namely, if the designer manages the floorplan modification program, it is possible for the designer to generate a program by deleting the modifications to be inhibited.

In the embodiment, the floorplan includes the blocks equal in size. However, the floorplan modification is possible with blocks having different block sizes. In such a situation, the modification is slightly limited to smoothly achieve the block movement and addition.

Even if the blocks have different sizes, when the block areas are modified to be equalized before the floorplan candidate generation/selection (step 603) shown in FIG. 6, the floorplan can be modified through the processing described above.

Figure 22:
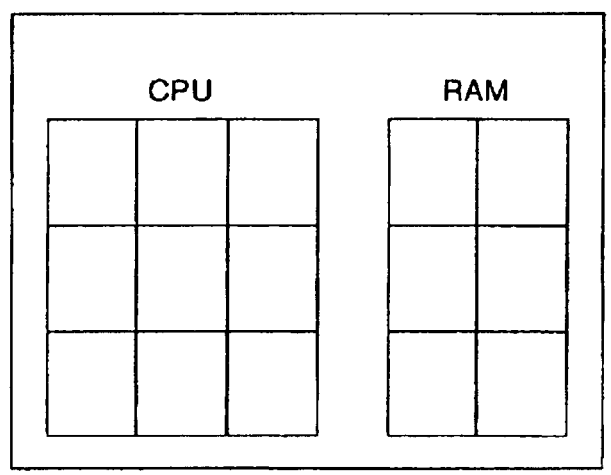
FIG. 22 is a diagram showing a system configuration of LSI modules.

In the embodiment, one floorplan has one function, for example, a function module for implementing the CPU. However, even if the CPU function module and the memory function module are combined with each other into one system module as shown in FIG. 22, the floorplan can be modified by executing the processing shown in FIG. 6 for each of the modules.

Description has been given on the floorplan tool utilizing the knowledge regarding the floorplan stored on the storage media as the knowledge of the designer. Next, description will be given on an operation in which the knowledge of the designer (i.e., test vector information for logic verification) is stored on the storage media to verify the logic circuits utilizing it.

Figures 24A, 24B:
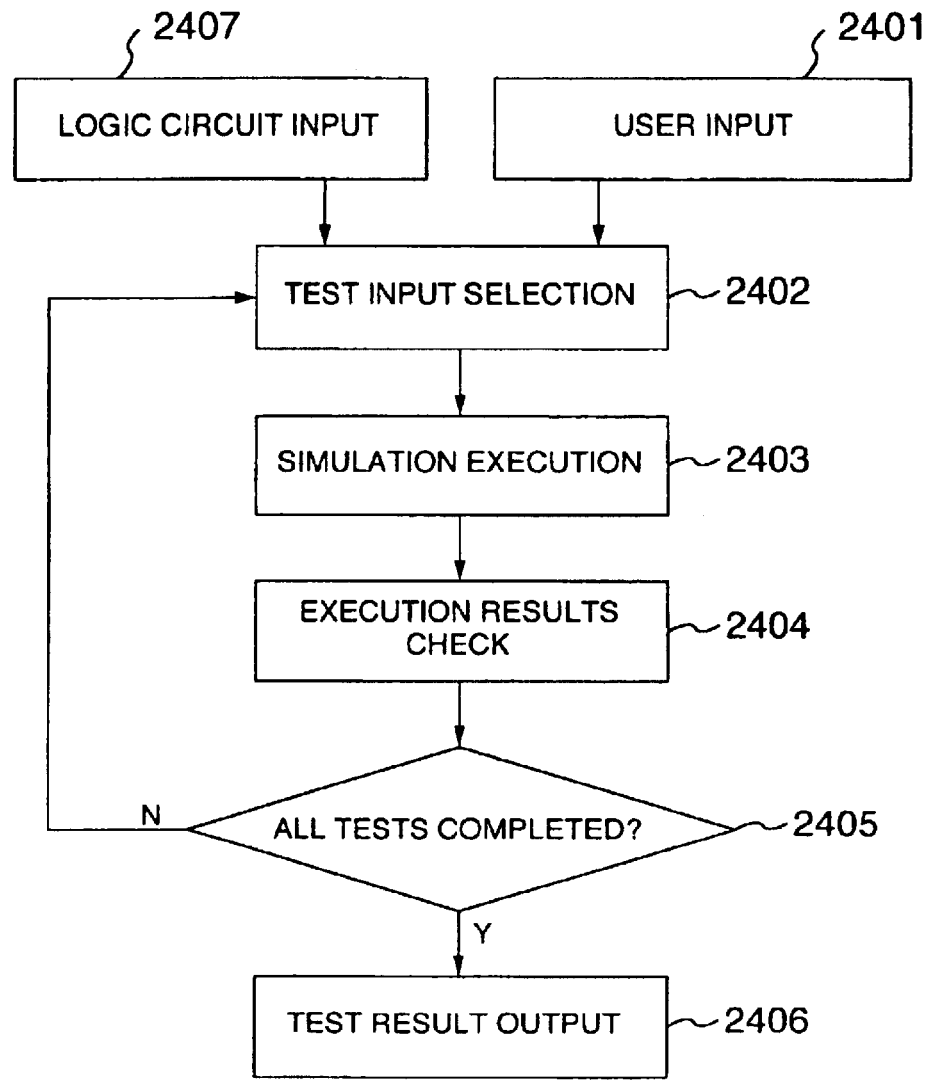
FIG. 24A is a flowchart showing an overall verification operation by simulation shown in FIG. 21.
FIG. 24B is a diagram showing an example of a test vector table.

Test vector information shown in FIG. 5 includes, for example, a test vector table shown in FIG. 24B, test input files test1.in, test2.in, . . . , test6.in and output expected value files test1.exp, test2.exp, . . . , test6.exp. The test input files and the output expected value files are referred from the test vector table.

FIG. 24A shows a flowchart of the overall logic verification by simulation shown in FIG. 21. Each step of the flowchart is executed by a computer for the verification.

In user input step 2401, the user inputs the maximum importance degree of the test to be executed, and inputs which block is tested. Ordinarily, all tests are executed. However, due to an insufficient test period of time, the test period can be reduced by executing only the test of importance degree "1". When the user desires to test only a particular block, the user inputs the name of the block to be tested. Even if the user instructs the execution of all tests, the tests are not executed for the removed blocks. For example, the user's specifications shown in FIG. 9B includes "remove f2" to indicate the removal of block f2. Consequently, tests for block f2 (test input "test4.in" and "test5.in" and output expectation values "test4.exp" and "test5,exp") are not executed.

In logic circuit input step 2407, a logic circuit at a gate level is read using the netlist 2103 or the mask generation 2105.

In test input selection step 2402, one test input file is selected according to the user input and the test vector table shown in FIG. 24B. In simulation execution step 2403, a logic simulator operates a logic circuit as a test object according to the test input, and then saves the output result. In execution result check step 2404, the simulation execution result is compared with the output expectation values for the matching thereof to save the comparison result. If the tests are not completely finished, the processing returns to the test input selection step 2402. When the tests are completed, all the results saved in the execution result check step 2404 are outputted (step 2406).

By using the test vector information, it is possible to easily conduct the verification according to the requests from the user. The removed blocks are not tested, so that the verification is efficiently carried out.

Description has been given on the floorplan tool utilizing the knowledge regarding the floorplan stored on the storage media as the knowledge of the designer. Moreover, description has been given on the logic verification method utilizing the test vector information stored on the storage media as the knowledge of the designer. In the method utilizing the knowledge of the designer stored on the storage media, the knowledge of the designer includes, in addition to the knowledge for the floorplan and the knowledge for the logic verification, the management of the combining or LSI synthesizing flow, the instructions and data correlation information for a built in self test (BIST), the exceptional transfer rules, the initializing information addition of flip-flops of the LSI or the like. In any situations, the information processing technology of the present invention can be used.

According to the present invention, only by inputting the user's specifications for the floorplan, the floorplan can be generated utilizing the knowledge of the designer.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An information processing system, comprising:

an input unit for receiving, from external of said information processing system, circuit information of a module constituting a semiconductor integrated circuit, a floorplan which is allocation information of blocks constituting the module, and evaluation indices, generated based on said circuit information of the module, for evaluating modifications of the floorplan, wherein the circuit information, floorplan and evaluation indices are associated with each other;

a storing unit for storing the associated circuit information, floorplan and evaluation indices; and a processing unit for reading the floorplan stored in the storing unit according to specification information for modifying the floorplan when the specification information is input, generating a plurality of floorplan candidates each being modified based on the read floorplan and the specification information, evaluating the generated floorplan candidates based on the evaluation indices stored in the storing unit, and selecting one floorplan based on an evaluation result, wherein the evaluation indices include know-how of a designer who designs a semiconductor integrated circuit to be used in evaluating a generated floorplan.

2. An information processing system, used for designing a semiconductor integrated circuit, comprising:

a storing unit for storing circuit information of a module constituting the semiconductor integrated circuit, a floorplan which is allocation information of blocks constituting the module, and evaluation indices, generated based on said circuit information of the module, for evaluating modifications of the floorplan, wherein the circuit information, floorplan and evaluation indices are associated with each other; and an input/output unit for transmitting the associated circuit information, floorplan and evaluation indices from the storing unit, wherein the evaluation indices include know-how of a designer who designs a semiconductor integrated circuit to be used in evaluating a generated floorplan.

* * * * *